United States Patent
James et al.

(10) Patent No.: US 6,954,823 B1
(45) Date of Patent: Oct. 11, 2005

(54) SEARCH ENGINE DEVICE AND METHOD FOR GENERATING OUTPUT SEARCH RESPONSES FROM MULTIPLE INPUT SEARCH RESPONSES

(75) Inventors: David V. James, Palo Alto, CA (US); Jagadeesan Rajamanickam, San Jose, CA (US); Sanjay M. Wanzakhade, San Jose, CA (US); Michael C. Stephens, Jr., San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 255 days.

(21) Appl. No.: 10/199,225

(22) Filed: Jul. 19, 2002

Related U.S. Application Data (60) Provisional application No. 60/343,973, filed on Dec. 27, 2001.

(51) Int. Cl.[7] .......................... G06F 12/00; G11C 15/00
(52) U.S. Cl. ......................................... 711/108; 365/49
(58) Field of Search ........................... 711/108; 365/49; 707/3, 6

(56) References Cited

U.S. PATENT DOCUMENTS

| | | | |
|---|---|---|---|
| 5,590,353 A | | 12/1996 | Sakakibara et al. |
| 6,542,391 B2 | * | 4/2003 | Pereira et al. .................. 365/49 |
| 6,845,024 B1 | * | 1/2005 | Wanzakhade et al. ......... 365/49 |

OTHER PUBLICATIONS

"IEEE Standard for Scalable Coherent Interface (SCI)", *IEEE Std 1596-1992*, Institute of Electrical and Electronic Engineers, Inc., New York, NY, pp. 4-25 and 47-72, May 23, 2001.

* cited by examiner

*Primary Examiner*—Gary Portka
(74) *Attorney, Agent, or Firm*—Bradley T. Sako

(57) ABSTRACT

According to one embodiment, a search engine device (100) may include an input (102), search portion (106), and a vote portion (108). A vote portion (108) may receive responses to a search request at inputs. According to precedence information in received responses, a vote portion (108) may generate an output response having its own precedence information.

11 Claims, 8 Drawing Sheets

| PRECEDENCE | | | |
|---|---|---|---|
| STATUS | CHIP | --- | INDEX |

FIG. 6

| STATUS ||
|---|---|
| RESPONSE | VALUE |
| 1 MATCH | 0 (0000) |
| MISS - FREE ENTRY | 1 (0001) |
| MISS - FREE SUB-BLOCK | 2 (0010) |
| MISS - FREE BLOCK | 3 (0011) |
| MISS - FULL | 4 (0100) |

FIG. 7

|  | RESPONSE 0 | RESPONSE 1 | RESULT |
|---|---|---|---|
| NOT MAGNITUDE STATUS | 1 MATCH | 1 MATCH | MULTI MATCH |
| | 1 MATCH | MISS - FREE ENTRY | 1 MATCH |
| | 1 MATCH | MISS - FREE SUB-BLOCK | 1 MATCH |
| | 1 MATCH | MISS - FREE BLOCK | 1 MATCH |
| | 1 MATCH | MISS - FULL | 1 MATCH |
| MAGNITUDE STATUS | MISS - FREE ENTRY | MISS - FREE ENTRY | MISS - FREE ENTRY |
| | MISS - FREE ENTRY | MISS - FREE SUB-BLOCK | MISS - FREE ENTRY |
| | MISS - FREE ENTRY | MISS - FREE BLOCK | MISS - FREE ENTRY |
| | MISS - FREE ENTRY | MISS - FULL | MISS - FREE ENTRY |
| | MISS - FREE SUB-BLOCK | MISS - FREE SUB-BLOCK | MISS - FREE SUB-BLOCK |
| | MISS - FREE SUB-BLOCK | MISS - FREE BLOCK | MISS - FREE SUB-BLOCK |
| | MISS - FREE SUB-BLOCK | MISS - FULL | MISS - FREE SUB-BLOCK |
| | MISS - FREE BLOCK | MISS - FREE BLOCK | MISS - FREE BLOCK |
| | MISS - FREE BLOCK | MISS - FULL | MISS - FREE BLOCK |
| | MISS - FULL | MISS - FULL | MISS - FULL |

FIG. 8

| PRECEDENCE 0 | | PRECEDENCE 1 | | RESULT PRECEDENCE | |
|---|---|---|---|---|---|
| STATUS | CHIP | STATUS | CHIP | STATUS | CHIP |
| 1 (FREE ENTRY) | 0 | 1 (FREE ENTRY) | 2 | 1 (FREE ENTRY) | 0 |

FIG. 9A

| PRECEDENCE 0 | | PRECEDENCE 1 | | RESULT PRECEDENCE | |
|---|---|---|---|---|---|
| STATUS | CHIP | STATUS | CHIP | STATUS | CHIP |
| 0 (1 MATCH) | 0 | 0 (1 MATCH) | 2 | 8 (MULTI MATCH) | 0 |

| PREC. A v B FIELD1 | PREC. A v B FIELD2 | RESULT | |
|---|---|---|---|
| = | = | EITHER A or B | 1200 |
| = | > | MULT w/ A | 1202 |
| = | < | MULT w/ B | 1204 |
| > | =/</> | A | 1206 |
| < | =/</> | B | 1208 |

FIG. 13

| A FIELD1 = B FIELD1 | "MULTIPLE" RESULT |
|---|---|
| SINGLE MATCH | MULTIPLE MATCH |
| MULTIPLE MATCH | MULTIPLE MATCH |
| MISS - FREE ENTRY | MISS - MULTIPLE FREE ENTRIES |
| MISS - MULTIPLE FREE ENTRIES | MISS - MULTIPLE FREE ENTRIES |
| MISS - FREE SUB-BLOCK | MISS - MULTIPLE FREE SUB-BLOCKS |
| MISS - MULTIPLE FREE SUB-BLOCKS | MISS - MULTIPLE FREE SUB-BLOCKS |
| MISS - FREE BLOCK | MISS - MULTIPLE FREE BLOCKS |
| MISS - MULTIPLE FREE BLOCKS | MISS - MULTIPLE FREE BLOCKS |

| STATUS | | |
|---|---|---|
| VALUE | NAME | DESCRIPTION |
| 0000 (0) | MATCH1 | HIT - SINGLE MATCHING ENTRY |
| 0001 (1) | ENTRY1 | MISS - SINGLE FREE ENTRY |
| 0010 (2) | SBLOCK1 | MISS - SINGLE FREE SUB-BLOCK |
| 0011 (3) | BLOCK1 | MISS - SINGLE FREE BLOCK |
| 0100 (4) | FULL | MISS - NO FREE ENTRIES |
| 0101 (5) | RESERVED | RES |
| 0110 (6) | RESERVED | RES |
| 0111 (7) | RESERVED | RES |
| 1000 (8) | MATCH2 | HIT -- MATCHING ENTRIES |
| 1001 (9) | ENTRY2 | MISS -- FREE ENTRIES |
| 1010 (A) | SBLOCK2 | MISS - FREE SUB-BLOCKS |
| 1011 (B) | BLOCK2 | MISS - FREE BLOCKS |
| 1100 (C) | RESERVED | RES |
| 1101 (D) | RESERVED | RES |
| 1110 (E) | RESERVED | RES |
| 1111 (F) | RESERVED | RES |

FIG. 17

| STATUS | PRIORITY | CHIP | INDEX |
|---|---|---|---|

SEARCH ENGINE DEVICE AND METHOD FOR GENERATING OUTPUT SEARCH RESPONSES FROM MULTIPLE INPUT SEARCH RESPONSES

This application claims the benefit of provisional application Ser. No. 60/343,973 filed Dec. 27, 2001.

TECHNICAL FIELD

The present invention relates generally to search engines, and more particularly to systems that include multiple search engine devices arranged in a cascaded configuration.

BACKGROUND OF THE INVENTION

Many conventional search engine systems typically include one or more search engine devices. A search engine device can include circuitry for performing one or more types of search operations. In a search operation, a comparand (or key) may be compared to multiple entries to see if all or a portion of the key matches an entry. After a search operation, a search engine may give a search result as an output. Typically a search result may include an "index" value, which may be used to access associated data to provide data itself.

Search engine devices may take a variety of forms. As but a few of the possible examples, some search engine devices are based on particular types of content addressable memory (CAM) cells. Such CAM cells may include storage circuits integrated with compare circuits. Examples of storage circuits may be static random access memory (SRAM) type cells or dynamic random access memory (DRAM) type cells. Alternate approaches to search engines may include random access memories (RAM) arrays, or the like, with separate matching circuits and/or processes.

Figure 19:
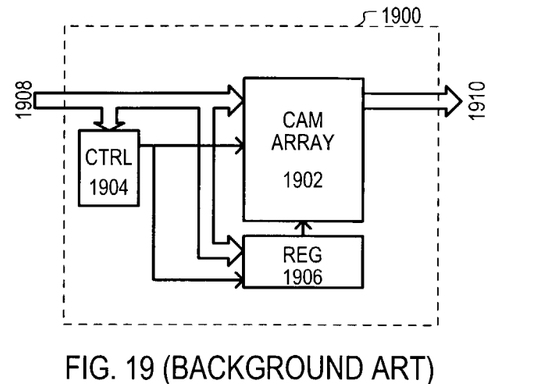
FIG. 19 is a block diagram of conventional CAM device.

Referring now to FIG. 19, a conventional CAM device 1900 will be described in more detail. A CAM device 1900 may include a CAM array 1902, CAM control circuits 1904, and comparand registers (CMPR) 1906.

A CAM array 1902 may have a number of entries for storing data values for comparison with a key value. Each entry may include a number of CAM cells. Data may be written to and/or read from entries. In particular embodiments, a key may be compared against multiple data values stored in such entries. If a data value in a CAM entry matches a key, a search hit may be indicated. Otherwise a search miss may be indicated. Search hits may generate index values. Entries within a CAM array 1902 can be divided into groups. As but one example, entries may be grouped into "blocks" that may have one or more common features (e.g., address range, or other programmable values). Still further, blocks may be divided into "sub-blocks" that may also have common features.

A CAM control circuit 1904 can take CAM control signals as inputs and generate signals that may control the operation of a CAM array 1902 and/or comparand registers CMPR 1906. Comparand registers CMPR 1906 can include a number of storage locations that may store key values used for search and other operations.

Having described an example of a CAM device, a conventional CAM search operation will now be described. To perform a search operation, a device such as a network processing unit (NPU) may provide a search command to a CAM device 1900 on a data/control bus 1908. Such a command may include a key value that can be compared to all or a portion of CAM entries within a CAM array 1902. A key value may then be stored in comparand registers CMPR 1906.

A CAM array 1902 may generate a result according to a comparison between a key and entries. Results may take various forms, including match results and/or miss results. If a key matches only one CAM entry, a single match result may be generated. If a key matches more than one CAM entry, a multiple match result may be generated. If a key does not match any entries, a miss result may be generated. Results may be provided on a result bus 1910. A single match result may take various forms. Typically, a single match result may be an index value that points to associated data, or the actual associated data itself. Multiple match and/or miss results may be indicated by particular output flags or the like.

One current application for search engine systems can be the processing of network packets. Search engine systems based on CAM devices, sometimes also referred to as "associative memory" systems, can provide rapid matching functions that are often included in routers and network switches to process network packets. As just one example, a router can use a matching function to match the destination (e.g., a destination Internet Protocol (IP) address) of an incoming packet with a "forwarding" table entry. The forwarding table entry can provide "next hop" information that can allow the incoming packet to be transmitted to its final destination, or to another node on the way to its final destination. Of course, search engine systems can also be used for applications other than network hardware.

To better understand the various features and aspects of a search engine system and system performance, two conventional search engine systems will now be described.

Figure 20:
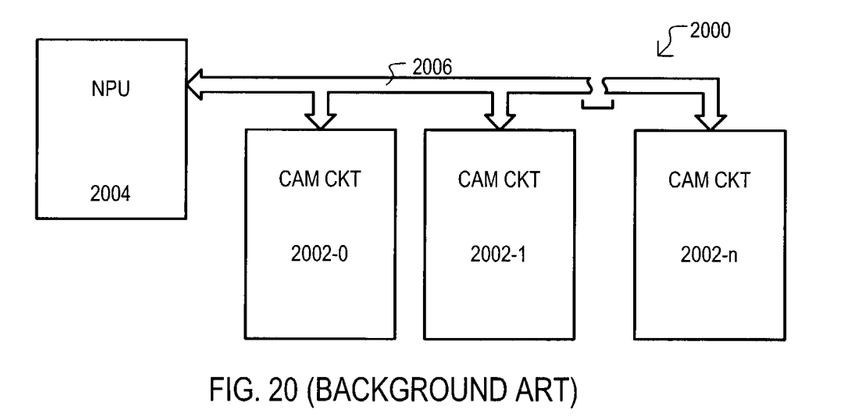
FIG. 20 is a block diagram of a first conventional search engine system.

A first conventional search engine system is shown in FIG. 20 and designated by the general reference character 2000. A conventional search engine system 2000 may be based on CAMs, and thus include one or more CAM devices, each of which may perform a search operation. In the example of FIG. 20, a search engine system 2000 includes "n+1" CAM devices, shown as 2002-0 to 2002-n. A search engine system 2000 may perform search operations in response to commands from a requesting device. In FIG. 20, a requesting device is an NPU 2004.

FIG. 20 shows an example of a bus based search engine system. In a bus based search engine system, CAM devices may be commonly connected to a requesting device and to one another by a common bus. Thus, in FIG. 20 CAM devices (2002-0 to 2002-n) can be commonly connected to each other and to an NPU 2004 by a bus 2006.

A drawback to bus based systems can be speed limitations. Larger interconnect lengths of bus lines as well as the input capacitances of each device can present considerable capactive loads for an NPU 2004 and CAM devices (2002-0 to 2002-n). Thus, while a bus based search engine system 2000 may be scaled up by increasing the number of CAM devices (2002-0 to 2002-n), such an approach may increase bus loading, reducing performance.

A bus based search engine system 2000 may have other drawbacks. Some sort of bus or other arbitration may be necessary to select one of multiple possible results. That is, while a search request may be issued from an NPU 2004 to CAM devices (2002-0 to 2002-n) simultaneously, individual search results for the CAM devices (2002-0 to 2002-n) can be generated, and some sort of mechanism may have to be included to select which particular response would be received separately by an NPU 2004. Special bus arbitration hardware may allow a "winning" device to transmit a result to an NPU 1604.

Further, some additional processing may be needed to process multiple results from multiple CAM devices. As but one example, more than one CAM device (2002-0 to 2002-n) may generate a match result in response to a key. Some sort of evaluation would then be necessary to establish a precedence between CAM devices (2002-0 to 2002-n). It is noted that such a precedence may make a system inflexible. As more and more CAM devices (2002-0 to 2002-n) are added, evaluating a search result can require that precedence between all devices must be know to ensure a highest precedence device result is provided as an output.

In particular bus based search engine systems, each CAM device may simultaneously compare a key with entries of its respective CAM array. If a CAM device has a match, the CAM device may forwards a match indication (e.g., a flag or the like) to a next, lower priority CAM device. A higher priority CAM device may output a result and a lower priority CAM device can be disabled from outputting data to the common output bus. If, however, a higher priority CAM device does not have a match, such a device may not assert a match indication, and a lower priority CAM device can provide an output result.

Such an approach may have the drawbacks of more complex connections, limited flexibility, and increased processing rate (rate at which results may be generated). More complex connections may arise, as a match indication must be transmitted from a higher priority CAM device to a lower priority CAM device. Such connections are not part of a bus, as such signals cannot be shared. Limited flexibility arises in that CAM device priority can be established by CAM device order. Thus, scaling such a system higher can require a design change to support additional circuits.

Increased processing rates may occur when many CAM devices are cascaded together. In such an arrangement, a lowest priority CAM device in the cascade may only output a result to a common output bus if no other previous higher priority CAM devices in the cascade have a match. That is, a lowest priority CAM device must wait until match indications from all previous CAM devices have rippled through each CAM device in a system. This may result in undesirably slow processing rates.

One way to increase a processing rate for systems like that described above, can be for each CAM device to provide a match indication to all lower priority CAM devices. Such a configuration can undesirably increase the number of input/output (I/O) pins and connections. Still further, in a "worst" case match (a match in a lowest priority CAM device), a match result cannot be generated until all higher priority devices generate a result.

Figure 21:
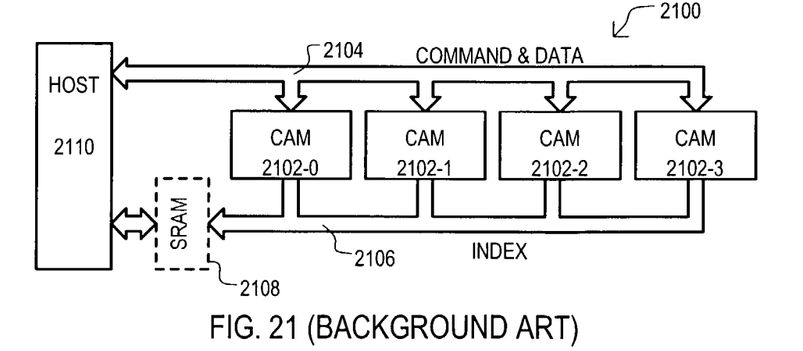
FIG. 21 is a block diagram of a second conventional search engine system.

A second conventional CAM system is set forth in FIG. 21 and designated by the general reference character 2100. A second conventional CAM system 2100 may include a number of CAM devices (2102-0 to 2102-3) having common connections to a command and data bus 2104, as well as separate common connections to an index or result bus 2106. Optionally, an index or result bus 2106 may be connected to one or more memory devices 2108, such as a static random access memory (SRAM).

In a system like that shown in FIG. 21, a search command may be issued from a host device 2110 on a command and data bus 2104. CAM devices (2102-0 to 2102-3) may process such commands and generate results, which may be output on an index or result bus 2106. Results may be returned to a command issuing host device 2110 by way of a result bus. Optionally, results may be applied to one or more memory devices 2108 to generate data that may then be accessed by a host device 2110.

A second conventional system 2100 may suffer from many of the drawbacks noted above. If a number of CAM devices is increased, bus loading can grow correspondingly. Further, some sort of logical protocol may be necessary to establish priority between results of multiple CAMs. As the number of CAM devices grows, such a protocol may get more complex or involve greater time periods for execution.

In light of the above, it would be desirable to arrive at some cascaded CAM system that may generate responses at an overall faster rate than conventional approaches, like that described above.

SUMMARY OF THE INVENTION

According to the present invention, a search engine system may include one or more voting sections. A voting section can generate output search status values. An output search status value may be generated in response to two or more received voting section search status values. Received search status values can be generated from a same search request.

According to one aspect of the embodiments, a voting section can generate output search status values based on a precedence of the received status values. This may occur when the received status values have certain predetermined values.

According to another aspect of the embodiments, a search engine system may include at least one search engine that receives a key value that can be compared to data values stored in a number of entries. Status values may correspond to any one of the following responses: a single match response that indicates the key value matches one entry of the search engine; a multiple match response that indicates the key value matches more than one entry of the search engine; a single free entry response that indicates the key does not match any entries of the search engine and at least one entry does not store a valid data value; a multiple free entry response that indicates the key does not match any entries of the search engine and at least two entries do not store valid data values; a single free sub-block response that indicates the key does not match any entries of the search engine and a sub-block of entries does not store valid data values, where a sub-block includes a plurality of entries; a multiple free sub-block response that indicates the key does not match any entries of the search engine and at least two sub-blocks do not store valid data values; a single free block response that indicates the key does not match any entries of the search engine and a block of entries does not store valid data values, where a block includes a plurality of sub-blocks; a multiple free block response that indicates the key does not match any entries of the search engine and at least two blocks do not store valid data values.

According to another aspect of the embodiments, a search engine system may include a voting section that outputs multiple result status values. A multiple result status value may be output in response to two received status values that have a predetermined single result status value. In one approach, single result status values and corresponding status result values can include any of the following: single matches and corresponding multiple matches; single free entries and corresponding multiple free entries; single free sub-blocks and corresponding multiple free sub-blocks; single free blocks and corresponding multiple free blocks.

According to another aspect of the embodiments, a search engine system may include multiple search engine devices. Each search engine device can provide a unique device identification value. A voting section may receive two or more search status values with corresponding device identification values. A voting section may generate an output search status based on a precedence between device identification values when the at least two responses both include a same predetermined search status value.

According to another aspect of the embodiments, a voting section may include one or more compare circuits. Compare circuits may compare a status value of a first response with a status value of a second response.

According to another aspect of the embodiments, compare circuits can include one or more magnitude comparators.

According to another aspect of the embodiments, a search engine system may also include a circuit that can apply search key values to one portion of entries within a search device. Such a circuit may provide an indication to a voting section that specifies to which portion of the entries a search key is compared.

The present invention may also include a method of generating one search response from received search responses. A method can include generating one or more output precedence values based on corresponding precedence values of two or more received responses.

According to another aspect of the embodiments, when precedence values of two or more received responses have the same value, a generated output precedence value can be one of the precedence values of the received responses. In one particular variation, the same value can include a status value that indicates a type of response and an index value that indicates a match result for a search.

According to another aspect of the embodiments, when two or more received responses have a same precedence value, an output precedence value can be different than the precedence values of the received responses. In one particular variation, the same status values can indicate a singular search result event. An output precedence value generated in response to such singular search result event status values can indicate multiple of the singular search result events.

According to another aspect of the embodiments, an output precedence value can be a precedence value of one of the received responses. An output precedence value can be generated according to a predetermined precedence. In one particular variation, a predetermined precedence can include a magnitude comparison between at least a first portion of received precedence values.

According to another aspect of the embodiments, an output precedence value may include any of the following: a status value that indicates a type of response, a priority value the indicates a priority associated with a plurality of entries in a search engine device, a device value that indicates one search engine device, and an index value that indicates a search result.

DETAILED DESCRIPTION OF THE EMBODIMENTS

Various embodiments of the present invention will now be discussed in conjunction with a number of figures. The embodiments show systems and methods for generating search results in a network of search engines or within such search engines, where such search engines can include CAM devices. Preferably, a network of search engines may be a cascaded network, in which a search engine may receive a result from a previous search engine in a sequence and/or provide a result to a subsequent search engine in a sequence.

Of course, alternate embodiments may include bus-based systems. In particular, requests may be delivered via a bus and received by devices in a system in a point-to-point fashion.

Figure 1:
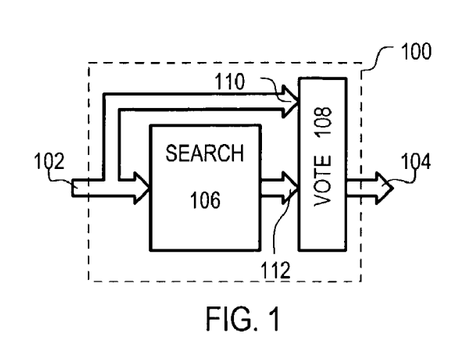
FIG. 1 is a block diagram of a search engine according to a first embodiment.

FIG. 1 is a block diagram of a search engine according to one embodiment. A search engine is designated by the general reference character 100, and may include an input 102, an output 104, a search portion 106, and a vote portion 108. A vote portion 108 may receive data at a first vote input 110 and a second vote input 112.

A vote first input 110 may receive search requests. In addition, if a search engine 100 follows another in a cascade configuration, a first vote input 110 may also receive responses from a previous search engine in a cascade configuration.

A second vote input 112 may receive a response from a search portion 106.

An output 104 may provide an output response. However, unlike conventional approaches, such a response can be generated from a local response and a remote response. A local response may be provided by a search portion 106. A remote response can be generated by a cumulative comparison of previous search engine responses in a cascade.

A search portion 106 may include circuits for performing one or more search engine related functions. Search engine related functions may include, without limitation, searches, reads, writes, parity checks, and "learns." A search operation can typically include applying a comparand value (also referred to as a key) to a number of data values stored in entries, or the like. According to such a comparison, a search portion 106 can generate a search response.

Search responses may include a match when a key matches one entry, a multiple match, when a key matches multiple entries, and a miss, when a key doesn't match any searched entry. Typically, match responses may be generated when each bit of a key matches each corresponding bit of an entry, or when bits of a key match corresponding non-masked bits of an entry. Preferably, miss responses may also take a variety of forms depending upon whether any additional entries are available (do not yet store data and/or are not considered valid for comparison with a key). More particularly, a miss response may indicate if a single entry is available, if a sub-block of entries is available (where sub-block includes a plurality of entries), if a block of entries is available (where block includes a plurality of sub-blocks), or if there are no more entries available (i.e., the search engine is full).

Read and write functions may read and write data to particular entries, respectively.

A learn function, may write a key value to an available entry in the event an initial search operation yields a miss response.

A parity check operation may check parity of entries, or portions of entries within a search engine device.

A search portion 106 may include a number of circuit blocks, including a command decoder and search circuit. A command decoder may decode received requests. A search circuit may include multiple entries and circuits for comparing data in such entries to a key value. In particular embodiments, a search circuit may include one or more CAM cell arrays.

A vote portion 108 may include circuits for outputting an output search response from received search responses. Received search responses may include precedence values for indicating a precedence of a given search result with respect to other search results. An output search response provided by a vote portion 108 may include its own precedence value generated from precedence values of received search responses.

In the example of FIG. 1, a vote portion 108 includes a first vote input 110-0 that can receive a "remote" response, and a second vote input 110-1 that can receive a "local" response. A remote response may be a search response generated from a previous CAM device in a cascaded chain. A local response may be a search response generated from a search portion 106. A vote portion 108 may generate an output response based upon a received local response and remote response. An output response may be provided at an output 104.

One skilled in the art would recognize that the term "vote" is utilized in a generally descriptive sense, and should not be construed as limiting a vote portion to a particular circuit structure or method flow.

Thus, unlike a conventional search engine, a search engine according to the present invention can generate an output response based on two or more received responses.

Figure 2:
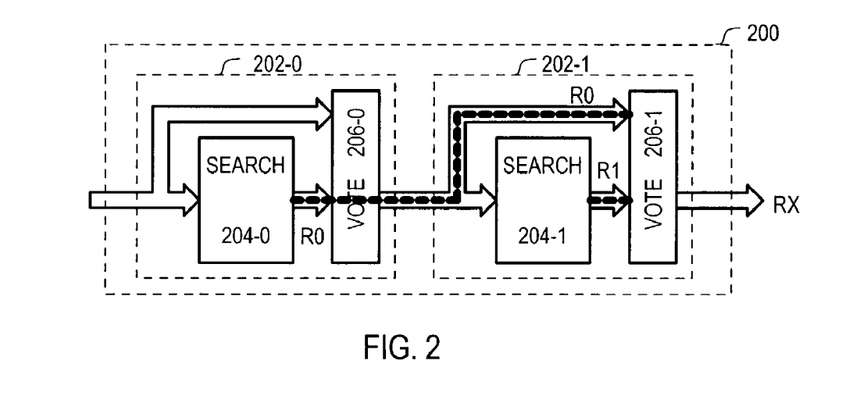
FIG. 2 is a block diagram showing a voting operation according to a first embodiment.

The operation of a voting section and a voting operation according to a first embodiment may be best understood with reference to FIG. 2. FIG. 2 shows a search engine system 200 that includes two search engine devices 202-0 and 202-1. Each search engine device (202-0 and 202-1) may have the same general structure as that shown in FIG. 1, including search portions (204-0 and 204-1) and vote portions (206-0 and 206-1).

A search engine device 202-0 may generate a first response from a search request. Such a response is shown as bold and dashed line R0. A response R0 may include precedence information, and can be applied to a next search engine device 202-1 in a cascade fashion.

Within search engine device 202-1, a response R0, including precedence information, may be applied to a vote portion 206-1. In addition, in response to a same previous request, a search portion 204-1 within search engine device 202-1 may generate its own response, shown as R1. Such a response R1 may include its own precedence information, and can be applied to vote portion 206-1. A vote portion 206-1 may "vote" according to precedence information within responses R0 and R1, and thereby generate an output response. Voting by precedence may be based on predetermined voting criteria.

A response generated by a vote portion 206-1 from received responses R0 and R1 is shown as RX in FIG. 2.

In this way, a search engine device may generate an output response having precedence data according to precedence data from two received responses.

Figure 3:
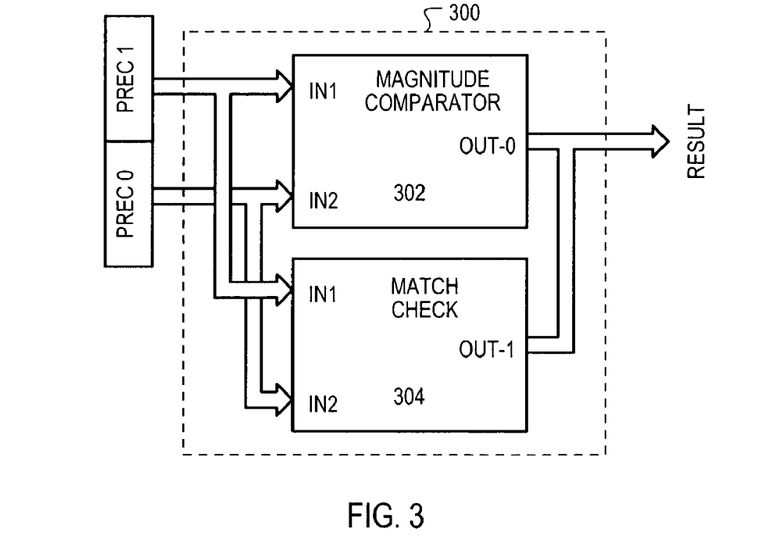
FIG. 3 is a block diagram of a voting portion according to a second embodiment.

Having described search engines and corresponding voting operations, one example of a voting portion is shown in FIG. 3. A voting portion is designated by the general reference character 300, and may receive at least two sets of precedence data, shown as PREC 0 and PREC 1, and provide a vote output result RESULT.

A voting portion 300 may include a magnitude comparator section 302 and a match check section 304. A magnitude comparator section 302 may include at least one magnitude comparator circuit that can compare all or a portion of a first set precedence data PREC 0 with all or a corresponding portion of a second set of precedence data PREC 1. All or a portion of a selected precedence value may then be output from a magnitude comparator section 302.

For example, a first set of precedence data PREC 0 could indicate a single match response (i.e., a key matches data of a single entry within a search engine), while a second set of precedence data PREC 1 could indicate a miss response (i.e., a key does not match any entries of a search engine). In such a case, a match response could have a higher precedence than a miss response. A magnitude comparator may detect such a difference in precedence and provide a RESULT that indicates the higher precedence data (PREC 0).

A match check section 304 may check precedence data (PREC 0 and PREC 1) to see if such values match one or more predetermined sets of values. In one approach, a match check section 304 may check sets of precedence data (PREC 0 and PREC 1) to see of both sets match a predetermined value. In such a case, a new precedence data may be generated that can differ from the original sets of precedence data (PREC 0 and PREC 1).

For example, a first set of precedence data PREC 0 could indicate a single match response, while a second set of precedence data PREC 1 could also indicate a single match response. In such a case, match check circuit may detect such a precedence data, and generate new precedence data indicating a multiple match response.

Figure 4:
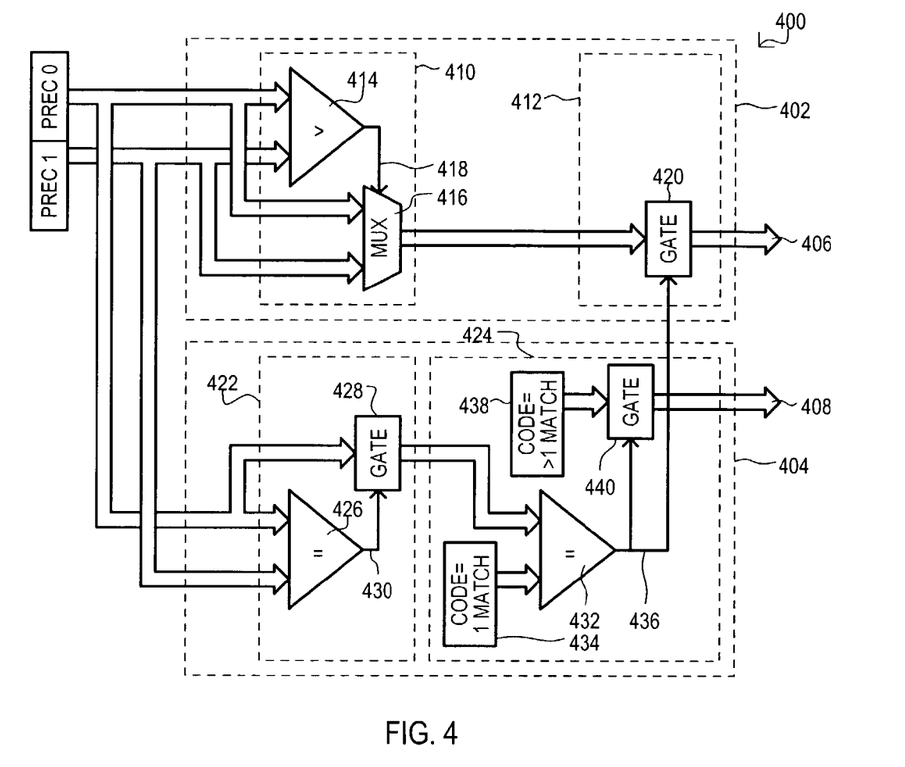
FIG. 4 is a block diagram of a voting portion according to a third embodiment.

Referring now to FIG. 4, a second embodiment of a voting portion is shown in a block diagram and designated by the general reference character 400. Like the embodiment of FIG. 3, a second embodiment voting portion 400 may receive at least two sets of precedence data (PREC 0 and PREC 1), and include a magnitude comparator section 402 and a match check section 404. A magnitude comparator section 402 may provide a first output 406 and a match check section 404 may provide a second output 408.

Referring to FIG. 4, a magnitude comparator section 402 may include a first compare circuit 410 and a gate circuit 412. A first compare circuit 410 may include a first comparator 414 and multiplexer (MUX) 416. A first comparator 414 may receive all, or a portion of a first precedence value PREC 0 at one input, and all, or a portion of a second precedence value PREC 1 at another input. A first comparator 414 may compare precedence values (PREC 0 and PREC 1). According to the magnitude of such values, a first comparator 414 may generate a magnitude determination 418. A magnitude determination 418 may control MUX 416.

Similarly, a MUX 416 may receive all, or a portion of a first precedence value PREC 0 at one input, and all, or a portion of a second precedence value PREC 1 at another input. According to a magnitude determination 418, a MUX 416 may output a value received at an input. More particularly, a magnitude determination 418 value enables MUX 416 to output all, or a portion of a precedence value (PREC 0 or PREC 1) having a higher precedence.

A control timing for a first compare circuit 410 may include applying precedence values (PREC 0 and PREC 1) to a first comparator, and subsequently enabling a MUX 416 according to magnitude determination 418.

A gate circuit 412 may include a first gate 420 that can allow or prevent an output from MUX 416 from being applied on output 406. In one particular arrangement, a first gate 420 may be enabled or disabled according to a match check section 404.

In this way, a magnitude comparator section 402 may selectively output one of a number of precedence values (PREC 0 or PREC 1) according to a magnitude of such values.

A match check section 404 may include a second compare circuit 422 and a third compare circuit 424. A second compare circuit 422 may include second comparator 426 and second gate 428. A second comparator 426 may receive all, or a portion of a first precedence value PREC 0 at one input, and all, or a portion of a second precedence value PREC 1 at another input. A second comparator 426 may compare precedence values (PREC 0 and PREC 1). Depending upon whether the precedence values (PREC 0 and PREC 1) are the same or not, a second comparator 426 may generate a first equality determination 430. A first equality determination 430 may control a second gate 428.

A third comparator circuit 424 may include a third comparator 432, a check value source 434, a substitute value source 438, and a third gate 440. A third comparator 432 may receive an output from second gate 428 at one input, and a check value from a check value source 434 at another input. A third comparator 432 may compare such inputs. Depending upon whether the inputs are the same or not, a third comparator 432 may generate a second equality determination 436. A second equality determination 436 may control a third gate 440. When enabled, a third gate 440 may selectively output a substitute value from substitute value source 438.

In the particular arrangement of FIG. 4, a second equality determination 436 may control a first gate 420 within a magnitude comparator section 402. Accordingly, if a precedence value provided from a second gate 428 matches a particular value from check value source 434, a value from substitute value source 438 may be output from third gate 440 and first gate 420 may be disabled. Conversely, if a precedence value provided from a second gate 428 does not match a value from check value source 434, a third gate 440 may be disabled, and value may be output from first gate 420.

A control timing for a match check section 404 may include applying precedence values (PREC 0 and PREC 1) to a second comparator 426, and subsequently enabling a second gate 428 according to a first equality determination 430. Subsequently, inputs may be applied to third comparator 432, after which a third gate 440 may be enabled according a second equality determination 436.

In this way, a match check section 402 may generate a substitute output value if precedence values (PREC 0 or PREC 1) both equal a predetermined check value. It is noted that in some arrangements a voting portion may include additional operations to detect special voting cases. As but one example, a first CAM device may generate a single match result having a given precedence. Such a result may be applied to second and third CAM devices arranged in parallel. Such second and third CAM devices may not generate results of higher precedence than that provided by the first CAM device. Consequently, the single match result generated by the first CAM device may flow through the second and third CAM devices and be voted on in a fourth CAM device. In such a special voting case it is desirable to not generate a multiple match precedence, but rather a single match precedence.

While various approaches may address such a voting case, one approach may compare a unique device (e.g., chip) identification value from incoming responses. If such a value is the same, multiple match results can be suppressed. Said in another way, when single match results from a same device are voted upon, a resulting precedence remains that for a single match result.

While FIG. 4 provides one very particular example of a voting portion, it is understood that such an example represents but one possible embodiment. A voting portion may also be represented by a state diagram. Such an embodiment is set forth in FIG. 5.

Figure 5:
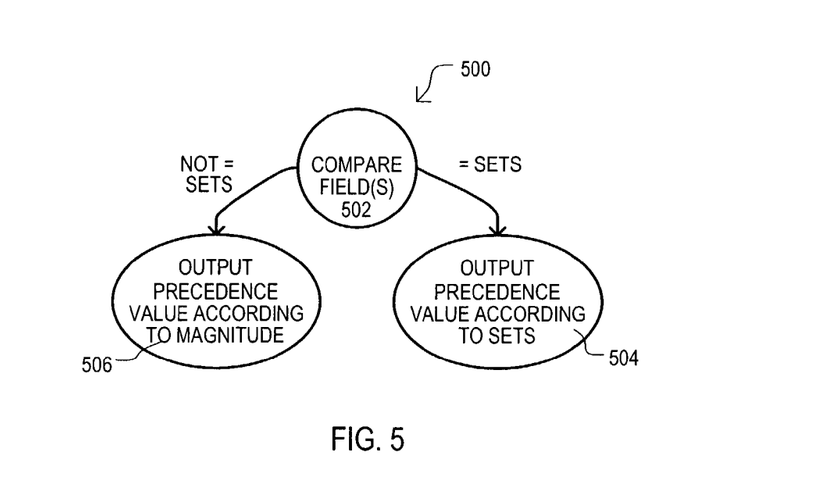
FIG. 5 is a state diagram of a voting portion according to an embodiment.

Referring now to FIG. 5, a voting portion method and/or device is shown in a state diagram. A voting portion 500 may include comparing fields of responses (502). If such fields are equal to one or more predetermined sets, a precedence value based on such predetermined sets may be output (504). Thus, an output precedence value may be different from originally compared fields. In particular embodiments, such an output precedence value can represent a cumulative value generated from originally compared fields. As but two very particular examples, if compared fields are equal to "single match" indication, an output value of "multiple match" may be output. Similarly, if compared fields are equal to "miss—free entry", an output value of "miss—free entries" may be output.

Referring back to FIG. 5, if compared fields do not equal predetermined set(s), a precedence value may be output according to magnitude (506). As but one very particular example, if one compared field is a "miss" while another is a "single match," a magnitude comparison of such fields, would result in the output of a single match.

As a device, a voting portion 500 may include circuits synthesized from the state diagram illustrated and/or custom designed.

In this way, a precedence value for an output response may be generated according to precedence values of received responses.

While various examples of responses and corresponding precedence values have been described, the present invention may include formats and responses that may be included in CAM related operations. Such examples will now be described in more detail.

Figure 6:
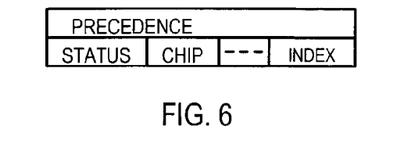
FIG. 6 is a diagram showing an example of precedence data according to an embodiment.

Referring to FIG. 6, one example of a precedence value PRECEDENCE is shown. A precedence value PRECEDENCE may be included in each response generated by a search engine device. The particular precedence value PRECEDENCE of FIG. 6 may include at least two fields. A status field STATUS may include a value that represents a precedence of a given result. A device field CHIP may include a value that represents a precedence of a given device (e.g., search engine). In one particular arrangement, a device field CHIP may be exclusive within a system. That is, when a search engine device generates a response, it may include its own unique value in a device field CHIP. In such an arrangement, precedence may always be determined, because if a status field STATUS of two responses is the same, a device field CHIP may resolve precedence.

A precedence value format like that shown in FIG. 6 may be applied in voting portions and methods, such as those illustrated in FIGS. 3 to 5. As but one example, both a status field STATUS and a device field CHIP may be applied as inputs to a magnitude comparator section (such as 302 in FIG. 3 and/or 402 in FIG. 4). However, a status field STATUS can be applied without a device field CHIP to a match check section (such as 304 in FIG. 3 and/or 404 in FIG. 4). In such an arrangement, a magnitude comparator section (302 and/or 402) may always select a higher precedence value, regardless of whether or not status fields STATUS are the same, while a match check section (304 and/or 404) may check to see if two responses are of a particular type (e.g., both single match).

Referring back to FIG. 6, an index field INDEX is also illustrated. An index field INDEX may be associated with a precedence value. More particularly, a search engine may receive a search request and/or search results, and determine a precedence value (in fields STATUS and CHIP) for an index value (in field INDEX). In this way, a status value STATUS and/or CHIP value may represent precedence factors for an index value. Also, index values (INDEX) may themselves decide precedence where other factors (e.g., STATUS and CHIP) are equal.

Figure 7:
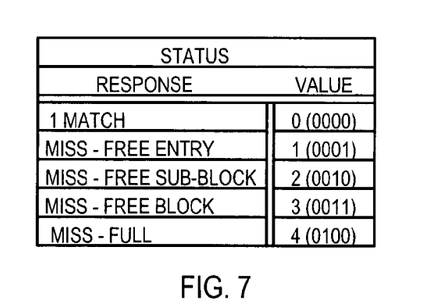
FIG. 7 is a diagram illustrating examples of responses and corresponding status values.

Referring now to FIG. 7, one example of status values and corresponding precedence values is shown in a table format. FIG. 7 shows five examples of responses: single match 1 MATCH, miss with free entry MISS—FREE ENTRY, miss with a free sub-block MISS—FREE SUB-BLOCK, miss with a free block MISS—FREE BLOCK, and miss with no free entries MISS—FULL. Details on these types of responses were described above with reference to FIG. 1.

Each response RESPONSE may have a corresponding status value VALUE. A status value VALUE may not only identify a response type, but may also represent a precedence of a given response versus other responses. FIG. 7 illustrates an example in which a lower magnitude status value VALUE can represent a higher precedence. Thus, a miss with a free entry MISS—FREE ENTRY has a lower magnitude (1) precedence than a miss with a free sub-block MISS—FREE SUB-BLOCK (2).

As also shown in FIG. 7, status values may take the form of multiple bits. In the particular example of FIG. 7, status values may be four bits. Of course, such a number should not be construed as limiting the invention thereto.

In this way various precedence fields (e.g., STATUS and/or CHIP) may have predetermined magnitudes that may be encoded into multiple bits.

Voting operations according to the present invention may not always be resolved by magnitudes or precedence of status values, as has been described above. An example of voting results for the various responses shown in FIG. 7 is set forth in FIG. 8.

Figure 8:
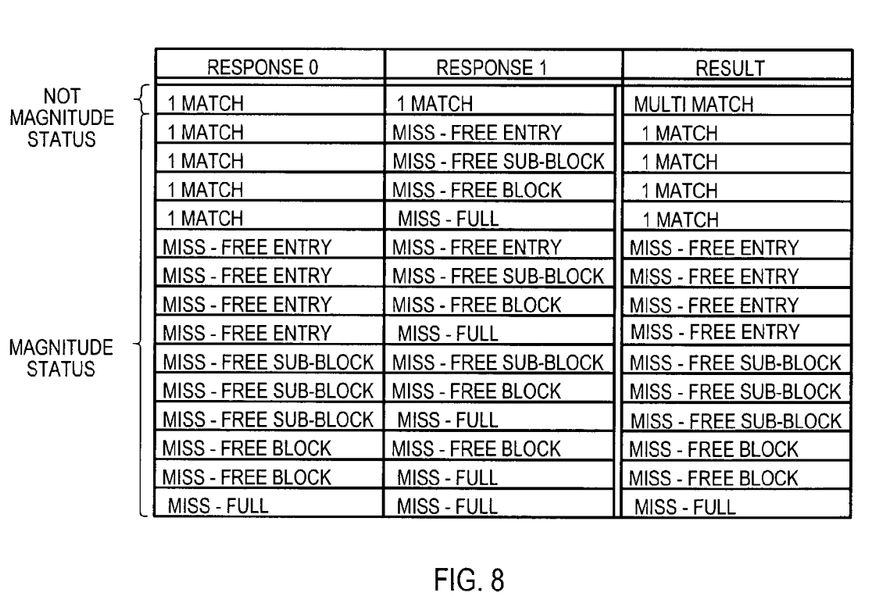
FIG. 8 is a diagram illustrating voting operation results according to status values of FIG. 7.

FIG. 8 shows a first column RESPONSE 0 that may represent a first type of status response received by a voting portion. A second column RESPONSE 1 may represent a second type of status response received by a voting portion. A third column RESULT may represent a status voting result generated from a first and second type response (RESPONSE 0 and RESPONSE 1).

FIG. 8 shows how some status results may be resolved by precedence value magnitudes, while others may not be resolved solely by precedence of status value magnitudes. In particular, status results resolved by precedence value magnitudes are shown in brackets "MAGNITUDE" while a status result not resolved solely by status value precedence magnitudes is shown in a bracket "NOT MAGNITUDE." Of course, results as shown in FIG. 8 are but one possible example, and should not necessarily be construed as limiting the invention thereto.

It is further noted that in the "NOT MAGNITUDE" case, other factors may determine a precedence of a response corresponding to a status value. For example, while two responses may have a same status value (1 MATCH), one response may be selected over another based on one or more additional criterion. As but a two examples, one of the "same status" responses may be selected according to a priority value that may be associated with a group of entries and/or one response may be selected according to a higher priority physical address of a matching entry. Thus, it is understood that FIG. 8 shows a determination of but one field within two responses.

Figure 9A:
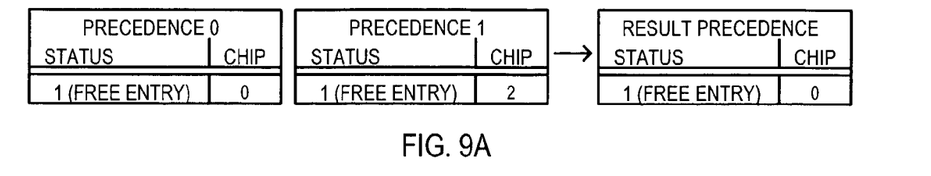
FIGS. 9A and 9B are diagrams illustrating examples of magnitude and non-magnitude voting operations, respectively.
Figure 9B:
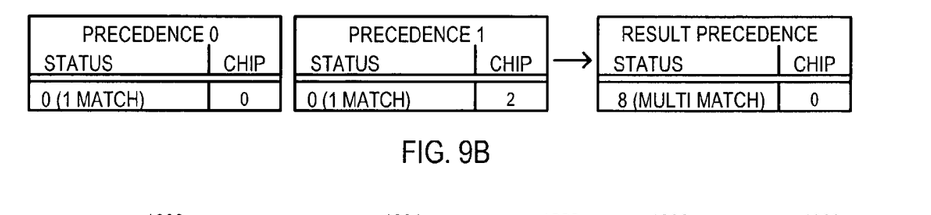

As shown in FIG. 6, a precedence value may include at least two different fields. An example of how results may be generated from multiple field precedence values will now be described with reference to FIGS. 9A and 9B. In FIGS. 9A and 9B, precedence values have a status field STATUS and a device field CHIP. A response corresponding to each status value STATUS is shown in parentheses. Responses can have precedence values like that indicated in FIG. 8. FIG. 9A shows an example of a voting operation resolved according to magnitude of precedence values. In FIG. 9A, two precedence values (PRECEDENCE 0 and PRECEDENCE 1) have a same status value 1 (MISS—FREE ENTRY), but different device values (0 and 2). In such a case, because status values STATUS are the same, a device value CHIP may determine precedence. Thus, in voting between precedence values (PRECEDENCE 0 and PRECEDENCE 1), a precedence value having a lower device identification value (PRECEDENCE 0) may be provided in a response output RESULT PRECEDENCE. In the particular example of FIGS. 9A and 9B, it is assumed that a lower device value has a higher precedence. Of course, the opposite could be true.

A result such as that shown in FIG. 9A may be generated by a magnitude comparator section (such as 302 in FIG. 3 and/or 402 in FIG. 4) that receives such precedence values as inputs.

FIG. 9B shows an example of a voting operation not resolved solely by magnitude. In FIG. 9B, two precedence values (PRECEDENCE 0 and PRECEDENCE 1) have a same status value 0 (1 MATCH), but different device or chip values (0 and 2). However, unlike FIG. 9A, such precedence values may not be processed solely according to magnitude. In such a case, status values STATUS may be examined, and a new STATUS value 8 (MULTI MATCH) may be generated. Thus, a response output RESULT PRECEDENCE may have a new STATUS value, and not a status value strictly from either input precedence values (PRECEDENCE 0 and PRECEDENCE 1). In the particular example of FIG. 9B, a higher precedence chip value (0) may also be included in a response output RESULT PRECEDENCE.

A result such as that shown in FIG. 9B may be generated by a match check section (such as 304 in FIG. 3 and/or 404 in FIG. 4) that receives status fields of such precedence values as inputs. Device identification fields may not be received. Further, in the case of the particular match check section 404 of FIG. 4, a status value 0 (1 MATCH) may be provided by a check value source 434 and a status value 8 (MULTI MATCH) may be provided by a substitute value source 438.

In this way, a voting portion may generate an output result resolved by relative magnitude of precedence values for some combinations of received responses, and not solely resolved by relative magnitude precedence values for other combinations of received responses.

Figure 10:
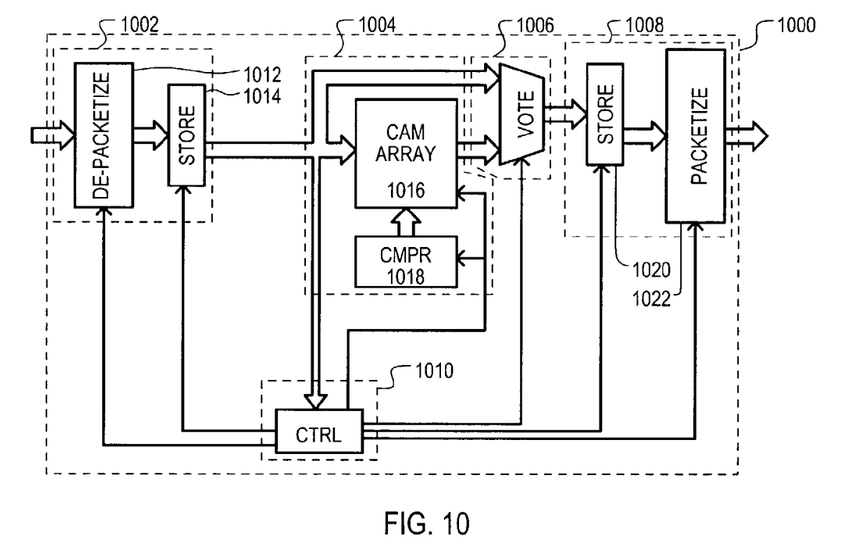
FIG. 10 is a block diagram showing a search engine device according to a fourth embodiment.

Referring now to FIG. 10, a block diagram of a search engine device according to a fourth embodiment is shown in a block diagram and designated by the general reference character 1000.

A search engine device 1000 may include an input section 1002, a search section 1004, a vote section 1006, an output section 1008, and a control section 1010. An input section 1002 may receive requests and/or responses and place them in a format compatible for processing by a search section 1004. The particular input section 1002 of FIG. 10 includes a de-packetizer 1012 and an input store 1014. A de-packetizer 1012 may receive requests and/or responses in a "packet" form. Particular forms of packet requests and/or packet responses will be described in more detail below. A de-packetizer 1012 may organize information from a received packet, and provide such information to an input store 1014.

In a very particular arrangement, a de-packetizer 1012 may include receiver circuits that receive data transmitted over a medium (e.g., one or more conductive lines), a decoder that decodes received data (e.g., a decoder that may decode encoded 10-bit values into 8-bit bytes). An input store 1014 may include first-in-first-out memory (FIFO) and/or a random access memory for storing data from a de-packetizer 1012.

It is understood that packet data does not necessarily imply any particular transmission protocol. Typically, packeted data may include a separation mechanism (e.g., idle codes, predetermined signals, etc.) that may distinguish one packet from the next. In addition, a packet may include format information for defining an arrangement of data within a packet (e.g., number of bytes, etc.).

Still further, while FIG. 10 shows an example of a search engine device 1000 that receives requests and provides responses in packet form, alternate embodiments may not be packet based. As but one example, requests may be received via input lines having predetermined assigned values, and responses may be provided on output lines having predetermined assigned values.

Data from an input store 1014 may be provided to a search portion 1004 and a control section 1010. In one arrangement, a control section 1010 may generate control signals for other parts of a search engine device 1000 according to information in one or more packet fields. More detail on such packet fields will be described below in conjunction with FIGS. 11A and 11B.

A search section 1004 may perform search related functions. In particular, a search section 1004 may compare a key value (e.g., a comparand) with multiple entries to generate a match (hit) indication or no match (miss) indication. In one arrangement, a search portion 1004 may include one or more CAM cell arrays 1016 and a comparand register set 1018. A CAM cell array 1016 may store data values in rows, or the like, for comparison with key values from a received request. Key values may be provided by an input store 1014 and/or may be stored in a comparand register set 1018.

A vote section 1006 may perform one or all of the various operations of vote portions noted above.

An output section 1008 may include an output store 1020 and a packetizer 1022. An output store 1020 may receive data for composing an output packet for a search engine device 1000. As but one example, an output store 1020 may include a first-in-first-out memory (FIFO) and/or a random access memory for storing data from a vote section 1006.

In a very particular arrangement, a packetizer 1022 may include an encoder that encodes outgoing data (e.g., an encoder that may encode 8-bit bytes into 10-bit values) and transmitter circuits that transmit such values over a medium (e.g., one or more conductive lines).

Figure 11A:
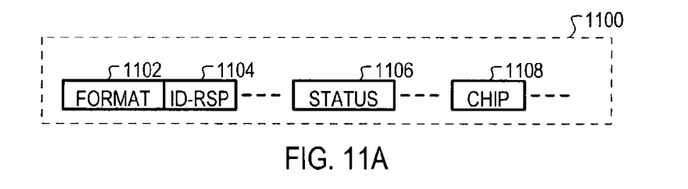
FIG. 11A is a block diagram showing various fields of a response packet according to an embodiment.
Figure 11B:
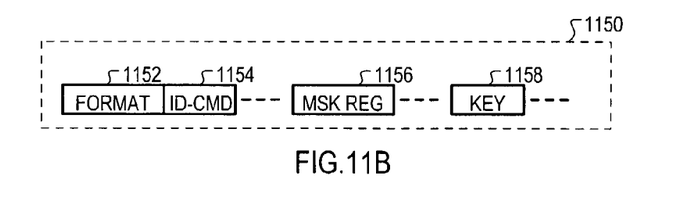
FIG. 11B is a block diagram showing various fields of a request packet according to an embodiment.

Examples of response and request format that may be used in conjunction with a fifth embodiment are set forth in FIGS. 11A and 11B.

FIG. 11A shows an example of various fields in a response packet according to an embodiment. A response packet is designated by the general reference character 1100 and may include a format field FORMAT 1102, a transaction identification field ID 1104, a status field STATUS 1106, and a device field CHIP 1108.

A FORMAT field 1102 may include data that can define a packet format. As but one very particular example, a FORMAT field 1102 may include a framing portion and a size portion. A framing portion may indicate the start of all or a portion of a packet. A size portion may indicate the overall amount of data within a packet.

A transaction identification field ID 1104 may indicate a particular type of packet. In one approach, a response may be indicated by one or more unique ID field values.

A status field STATUS field 1106 may include values like those described above, such as in FIGS. 7 and 8.

A device field CHIP 1108 may include values like those described above, such as in FIGS. 7 and 8.

FIG. 11B shows an example of various fields in a request packet according to an embodiment. A request packet is designated by the general reference character 1150 and may include a format field FORMAT 1152, a transaction identification ID 1154, a mask register field MSK REG 1156, and a key field KEY 1158.

A format field FORMAT 1152 may have the same general configuration as format field FORMAT 1102 in FIG. 11A.

A transaction identification field ID 1154 may indicate a destination for a request packet. In one approach, such values may be targeted at one or more selected devices and/or may be "broadcast" values targeted; or aimed; or addressed; or sent to all or a predetermined number of search engine devices.

A mask register field MSK REG 1156 may indicate if a mask is used in a search operation. In one particular arrangement, a predetermined value in a mask register field 1156 may indicate that no mask is used in a search, while other predetermined values may be indexes to a mask register that stores a mask value.

A key field KEY 1158 may include a key value or index to a key value already stored in a search engine. As but one example, a key field KEY 1158 may identify a register within a search engine device that stores a key value.

Examples of a search engine operation according to a fifth embodiment will now be described with reference to FIGS. 10, 11A and 11B. It will be assumed that a search engine device 1000 is preceded in a cascade structure (or chain) by another search engine device. Further, that a search engine device may receive a request packet that is followed by a response packet.

A search engine device 1000 may receive a request packet having fields such as those shown in FIG. 11B. Thus, a request can indicate a search operation and include a search key, a mask register value, a transaction identification, and format information. A request packet may also include a field that identifies a command, such as a search for a request packet. In even more particular arrangements, a request may further include a "target" value that can result in an application of a search key to only selected portions of a search section 1004. A soft priority value may also be included that may be a priority value that can be compared to programmable priority values on a device. Each programmable priority value may be associated with a predetermined portion of a search section 1004.

A de-packetizer 1012 may receive a request packet, and store all or part of such a request packet in an input store 1014. Upon storing a request packet, a de-packetizer 1012 may notify a control section 1010 that a new packet has, or is being received.

A control section 1010 may apply a search command and key, or the like, from an input store to a search section 1004. In the particular example of FIG. 10, in response to a search command and key (or index to a key), a compare section 1004 may apply a key value to a CAM cell array 1016. A CAM cell array 1016 may contain a plurality of CAM cell rows. In particular arrangements, a control section 1010 may also send other values to a search section 1004, such as target values and/or soft priority values mentioned above.

In response to a search command and key, a CAM cell array 1016 may output a search status to a vote section 1006. In addition, a vote section 1006 may also receive additional information, including a device identification value 1108 and/or search related information, such as an index or the like.

As noted above, a response packet may also be received by a search engine device 1000. Preferably such a response may be received as a search command is processed in a CAM cell array 1016.

A de-packetizer 1012 may receive a response packet, and store all or part of such a response packet in an input store 1014. Upon storing a response packet, a de-packetizer 1012 may notify a control section 1010. A control section 1010 may receive a transaction identification 1104 that indicates a received packet as a response. In the particular example of FIG. 10, such a response may be applied to a vote section 1006. Thus, a vote section 1006 may receive a response from a packet as well as a response from a CAM cell array 1016.

A vote section 1006 may "vote" on such status values to generate an output response.

While various voting approaches have been noted above, a voting method and apparatus according to a sixth embodiment will now be described with reference to FIGS. 12 to 14.

Figure 12:
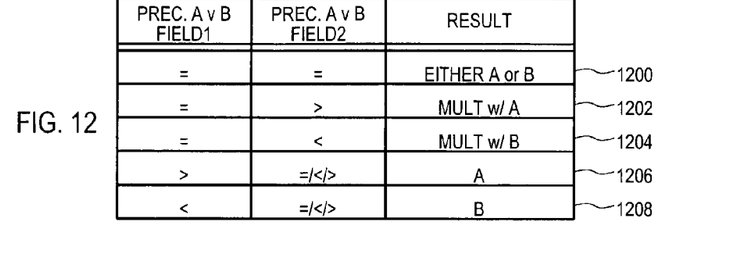
FIG. 12 is a diagram showing precedence by multiple fields according to one embodiment.

FIG. 12 is a table illustrating voting results for two responses, A and B. Precedence values for responses A and B are shown as PREC A and PREC B, respectively. Both PREC A and PREC B may include at least two fields. Such fields are shown as FIELD1 and FIELD2. Various results may arise according to a comparison between such fields (FIELD1 and FIELD2).

A first row 1200 in FIG. 12 illustrates a result when both fields (FIELD1 and FIELD2) match one another. In such a case, either result (A or B) may be generated.

A second row 1202 illustrates a result when a first field (FIELD 1) is the same for the precedence values (PREC A and PREC B), but a second field of PREC A has a higher precedence than a second field of PREC B. In such a case, a "multiple" result may be output for a first field (FIELD 1) and a second field (FIELD2) may be taken from the higher PREC A. Examples of "multiple" results will be described in more detail below.

In a similar fashion to a second row 1202, a third row 1204 illustrates a result when a first field (FIELD1) is the same for the precedence values (PREC A and PREC B), but a second field of PREC B has a higher precedence than a second field of PREC A. In such a case, a "multiple" result may be output for a first field (FIELD1) and a second field (FIELD2) may be taken from the higher PREC B.

A fourth row 1206 and a fifth row 1208 show results decided according to precedence of a first field. In particular, if a first field (FIELD1) of PREC A has a higher precedence than a first field of PREC B, a response A will be output. But if a first field (FIELD1) of PREC A has a lower precedence than a first field of PREC B, a response B will be output.

In one particular embodiment, evaluation of precedence may occur in top row 1200 to bottom row 1208 order, with a first precedence result from a row having precedence over lower rows.

As noted above, certain cases may generate "multiple" results. More particularly, some responses may have identical first fields, but different second fields.

Figure 13:
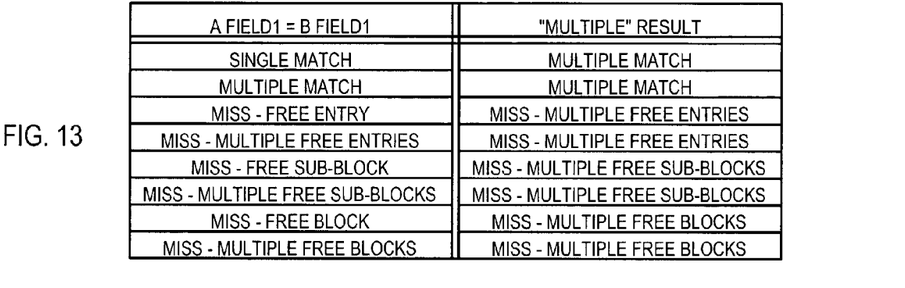
FIG. 13 is a diagram showing various single result responses and corresponding multiple result responses.

FIG. 13 shows one particular set of multiple codes for eight possible response types. Such cases arise when first fields are the same, but second fields are different. Examples of first field values are shown in column A FIELD1=B FIELD1, corresponding multiple field values are shown in column "MULTIPLE" RESULT.

In this way, when response precedences are similar but not identical (less than all fields match), a particular multiple response may be generated that represents a "weighted" voting between the two similar responses.

Figure 14:
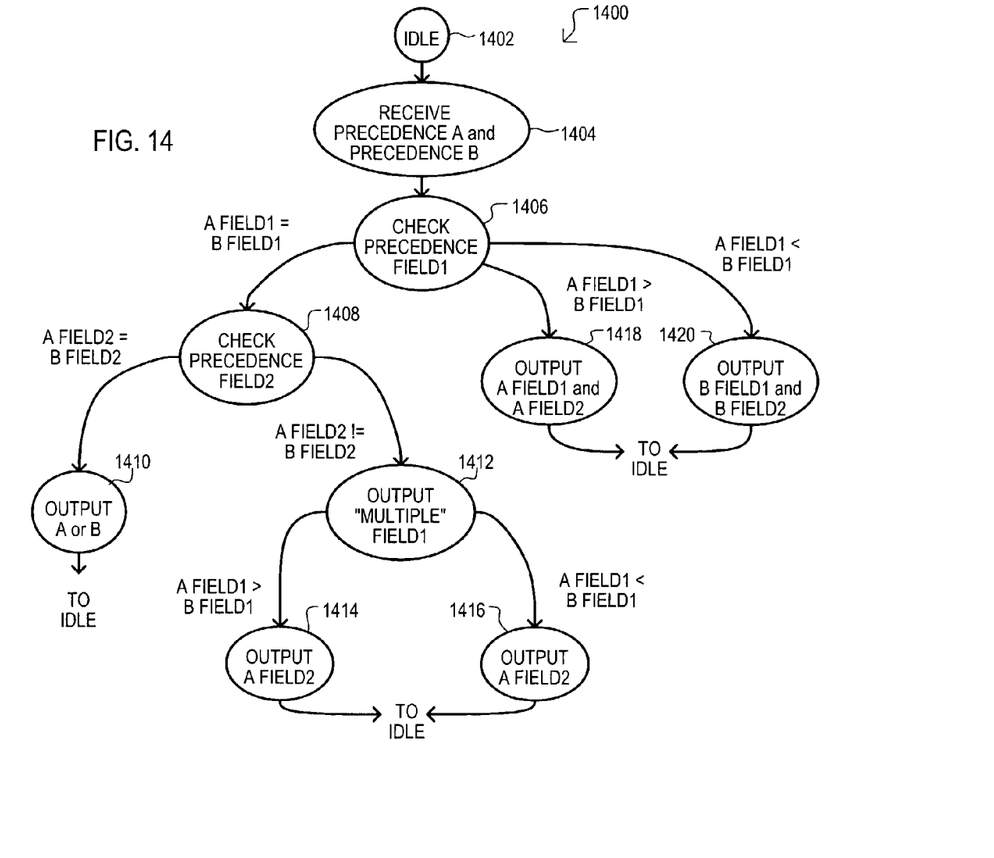
FIG. 14 is a state diagram showing a voting section and method according to a fifth embodiment.

FIG. 14 is a state diagram showing one particular voting method and apparatus 1400. In FIG. 14, a state machine/method may begin in an idle state 1402. Two precedence values may be received 1404. At least a first field in each precedence value may be evaluated 1406. If first fields are the same (A FIELD1=B FIELD1), at least a second field in each precedence value may be evaluated 1408. If such second fields are the same (A FIELD2=B FIELD2), a precedence for either response may be output from a voting method or apparatus 1400. Such a transition through logic states may correspond to a row 1200 in FIG. 12.

Referring back to FIG. 14, if first fields are the same (A FIELD1=B FIELD1) but second fields are not the same (A FIELD2!=B FIELD2) a multiple result may be generated for a first field of an output precedence 1412. If a second field of precedence A has a higher precedence than a second field of precedence B, a second field for an output precedence may be the same as a response A. Such a transition through logic states may correspond to a row 1202 in FIG. 12. If a second field of response A has a lower precedence than a second field of response B, a second field for an output precedence may be the same as a response B. Such a transition through logic states may correspond to a row 1204 in FIG. 12.

Referring yet again to FIG. 14, if a first field of precedence A has a higher precedence than a first field of precedence B, both first and second precedence fields of an output precedence value may be the same as a response A. Such a transition through logic states may correspond to a row 1206 in FIG. 12. If a first field of precedence A has a lower precedence than a first field of precedence B, both first and second precedence fields of an output precedence value may be selected from response B. Such a transition through logic states may correspond to a row 1208 in FIG. 12.

Of course, FIG. 14 shows one particular embodiment and should not be construed as limiting the invention thereto.

Figure 15:
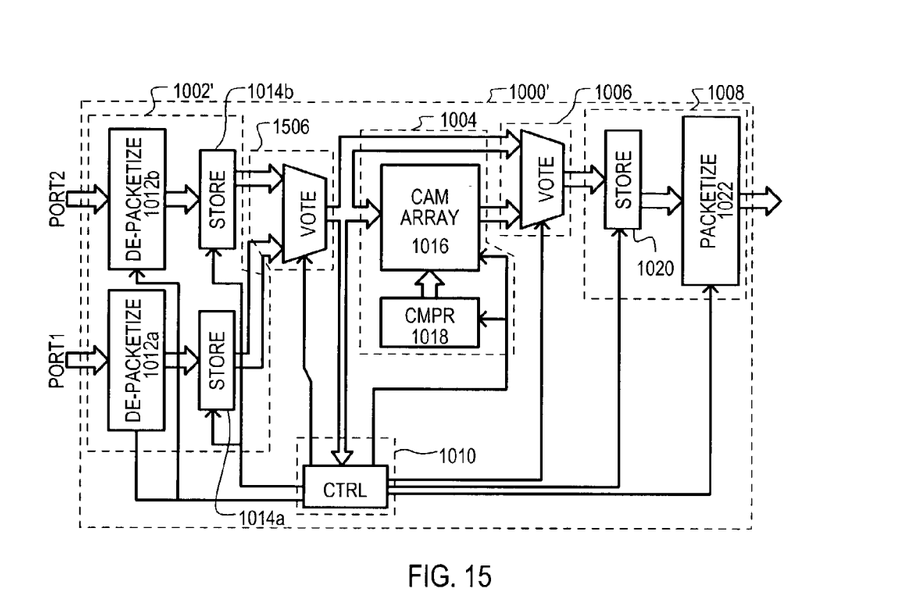
FIG. 15 is a block diagram of a search engine device according to a sixth embodiment.

Referring now to FIG. 15, a block diagram of a search engine device according to a fifth embodiment is shown in a block diagram and designated by the general reference character 1000'.

A search engine device 1000' may include the same general sections as FIG. 15. To that extent, like portions are referred to by the same reference character. A search engine device 1000' according to a fifth embodiment may differ from that of FIG. 10 in that an input section 1002' may receive request and/or response packets via two input ports PORT1 and PORT2. Consequently, an input section may include two de-packetizers 1012a and 1012b, as well as two input stores 1014a and 1014b.

A fifth embodiment search engine device 1000' may further differ in that a second vote section 1506 may be included between an input section 1002' and a search section 1004. A second vote section 1506 may operate in the same general fashion as a vote section 1006. Thus, data from a received request packet may be passed on to a compare section 1004. In addition, two different responses received at input ports PORT1 and PORT2 may be "voted" on to generate an output response, as described in various embodiments above.

In this way, a search engine device may provide "input" voting to vote between two received responses, as well as "output" voting to vote between an internally generated response, and a response generated from an input vote.

Figure 16:
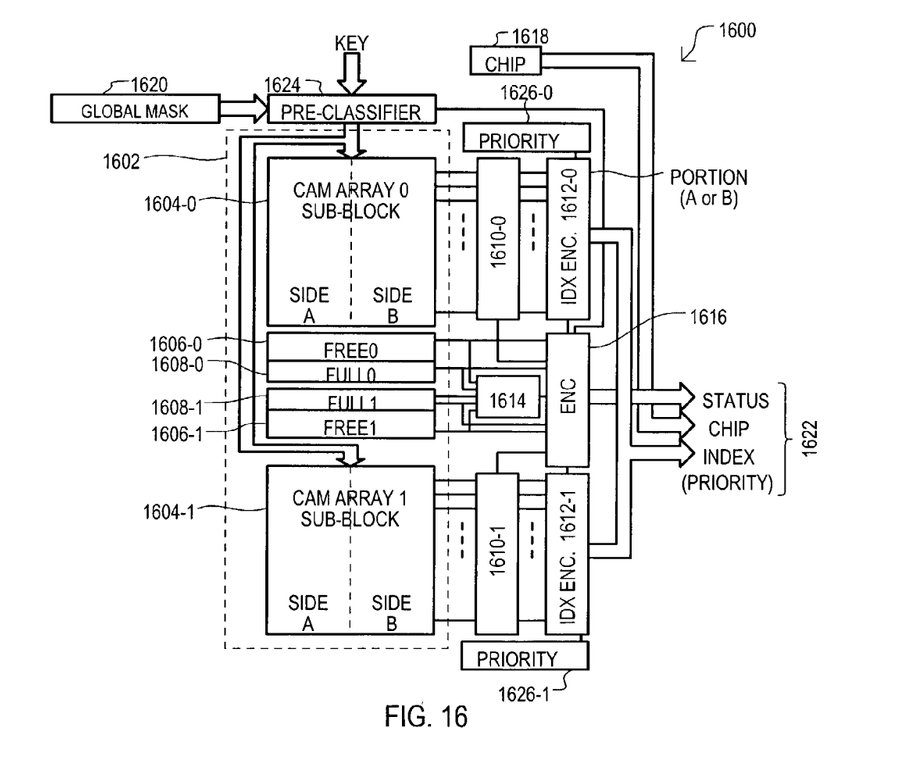
FIG. 16 is a block diagram of a content addressable memory (CAM) that may be included in a search engine device of the present invention.

Referring now to FIG. 16, a compare section of search engine according to one embodiment is set forth in block schematic diagram. A compare section may be considered a content addressable memory (CAM) and is designated by the general reference character 1600.

The very particular CAM of FIG. 16 may include at least one block 1602. A block 1602 may include a number of CAM entries. Such CAM entries may further be divided into at least two sub-blocks 1604-0 and 1604-1. Of course, while FIG. 16 shows two-sub-blocks, a CAM may include many more than two such sub-blocks. Each sub-block (1604-0 and 1604-1) may include an array of CAM cells.

Each sub-block (1604-0 and 1604-1) of a CAM may include one or more "use" indicators. One such indicator may be a free sub-block indicator (1606-0 and 1606-1). A free sub-block indicator (1606-0 and 1606-1) may indicate when all entries of a sub-block (1604-0 and 1604-1) are free. That is, there are no valid data values within a sub-block (i.e., there are no values available for comparison to a key within a sub-block).

In addition or alternatively, a CAM may include a full sub-block indicator (1608-0 and 1608-1). A full sub-block indicator (1608-0 and 1608-1) may indicate all entries of a sub-block (1604-0 and 1604-1) are in use or considered available or valid for search operations. That is, there are no free entries.

A CAM 1600 may further include processing circuits for generating various compare results. For example, a CAM may indicate a single match, a multiple match, and can generate an index value. In the very particular case of FIG. 16, in response to the application of a search key, each sub-block (1604-0 and 1604-1) may generate match indications for valid entries. Match indications may be provided to match detectors (1610-0 and 1610-1). Match detectors (1610-0 and 1610-1) may provide signals that indicate if more than one match indication is active and/or if a single match indication is active.

In a CAM according to an embodiment of the present invention, match indications from a sub-block (1604-0 and 1604-1) may also be provided to an index encoder (1612-0 and 1612-1). An index encoder (1612-0 and 1612-1) may generate an index value corresponding to an active match indication. In one particular arrangement, an index encoder (1612-0 and 1612-1) may be a priority encoder that generates indexes from a priority inherent in CAM entries, such as per their physical address location.

Index values from an index encoder (1612-0 and 1612-1) may provide an index field for a precedence value PRECEDENCE.

Referring again to FIG. 16, a CAM 1600 may include a logic circuit 1614 that may logically combine various sub-block use indicators to generate various other indicators. A logic circuit 1614 may combine certain sub-block indications to generate other sub-block indications. As but one example, if at least one entry of a sub-block is in use, a logic circuit 1614 may output a "false" free sub-block indication. That is, a false free sub-block indication can indicate that a sub-block is in use. Further, if at least one entry within a sub-block remains available, a logic circuit 1614 may output a "false" full sub-block indication. That is, a false full sub-block indication can indicate that at least one entry within a sub-block is available. Such signals may be combined to generate other sub-block indications. In particular, if a false free sub-block indication and false full sub-block indication can result in a true free entry indication.

In addition, or alternatively, a logic circuit 1614 may combine certain sub-block indications to generate block indications. As but a few examples, if all sub-blocks in a block provide free sub-block indications, a "free block" indication may be generated. Similarly, if more than two sub-blocks provide a "free entry" indication, a logic circuit may generate a "free entries" indication.

Of course, while the above example generates block indications from sub-block indications, a CAM may include block indications in addition to sub-block indications. Thus, block indications would not be generated from sub-block indications. Thus, the present invention should not be construed as being limited to cases where block indications are always generated according to sub-block indications.

In the particular example of FIG. 16, a CAM may further include an indication encoder 1616. An indication encoder 1616 may encode values provided by a logic circuit 1614 into status values. That is, an indication encoder 1016 may encode particular status indications (e.g., single match, multiple match, miss—free entry, miss—free sub—block, miss—free block, etc.) into unique values.

A unique device identification value may be stored in a device identification register 1618.

A CAM 1600 shown in FIG. 16 illustrates a CAM that may mask an applied key value. A key value may be masked by a global mask stored in a mask register 1620. Of course, a CAM may provide various other masking approaches. CAM entries may be masked on an entry-by-entry basis, or no masking may be included.

Various output values from a CAM may be combined to generate a precedence value 1622. In FIG. 16, a precedence value 1622 may include a status value, a chip value, and an index value.

While a voting portion may receive and provide responses with a status value and index value, such as that shown in FIGS. 6 and 16, additional information can be provided with a status value as well.

FIG. 16 shows how a response may be generated that includes a portion value PORTION. A portion value PORTION may indicate a particular portion of an entry that can be compared to a key. As but one example, in FIG. 16 a CAM array sub-block (1604-0 and 1604-1) may be subdivided into at least two portions (side A or side B). A pre-classifier 1624 may selectively combine portions of a key value with portions of a mask to effectively mask off one portion (e.g. side B) of CAM device entries in a search operation. A pre-classifier 1624 may then selectively combine portions of a key value with portions of a different mask to effectively mask off a second portion (e.g., side A) of CAM device entries in a search operation. An indication of which portion(s) of entries can be masked may be indicated by a request applied to a search engine. Such a search will be referred to herein as a "portion" search.

In response to a portion search, a pre-classifier 1624 may output search identification signals that correspond to partial search responses. Thus, a "single match" for one side (e.g., side A) may result in different search identification signals than a single match for another side (e.g., side B), which may result in even different search identification signals for a single match for both sides (e.g., not a portion search).

In one very particular embodiment, a pre-classifier 1624 may apply search identification signals to an indication encoder 1616. Thus, when such search identification signals indicate a particular portion search, an encoder may generate a status value that distinguishes between a status for a portion search (e.g., side A or side B) and a status value for a non-portion search.

Of course, data distinguishing a portion search from a non-portion search may be included in an entirely separate field than a status field STATUS.

FIG. 16 shows yet another feature that a search engine device may provide in response to search results. FIG. 16 shows but one way in a search engine device may include a priority value for selected groups of entries. In FIG. 16, a CAM (which may be search/compare portion of a search engine) may have entries with associated priorities. In particular, sub-blocks may include at least one set of entries with predetermined priority values.

The particular example of FIG. 16 shows a first priority indicator 1626-0 that may be associated with sub-block 1604-0. A first priority indicator 1626-0 may store a priority value associated with a first group of entries (e.g., the entries of sub-block 1604-0). Similarly, a second priority indicator 1626-1 may be associated with sub-block 1604-1. A second priority indicator 1626-1 may store a priority value associated with a second group of entries (e.g., the entries of sub-block 1604-1).

Priority values may be "hard" priorities established by circuits within a CAM or may be "hard" priorities in one mode and "soft" priorities in another mode. In the latter case, such hard priorities may establish a mode that is backward compatible with products that do operate according to soft priorities. However, priority values may preferably be "soft" priority values that can be programmable. As but a few of the numerous possible ways of establishing such a soft priority, a search engine may include volatile and/or nonvolatile storage circuit that store a priority value associated with a collection of entries, or may be programmable directly (e.g., a user can write to registers for storing such priority values) or indirectly.

Priority values are not necessarily unique. For example, a priority value from first priority indicator 1626-0 may be the same as (or different from) a priority value from a second priority indicator 1626-1.

Preferably, a priority value may be another piece of information provided by a search engine in response to a search request. As but a few of the many possible examples, search results generated from a CAM may include a priority value along with a status value STATUS, device value CHIP, index value INDEX. Thus, an output from CAM of FIG. 16 is shown to possibly include a priority value PRIORITY (in parentheses below INDEX).

Still further, a priority value may also be applied to a search section, or the like, as part of a search request. An application of such a priority value can restrict a search to only entries having a certain priority value (e.g., equal, higher or lower priority).

Thus, an output response provided by a search engine device may include a priority value PRIORITY encoded with other values (STATUS and/or CHIP) that are associated with an index value INDEX.

Figure 17:
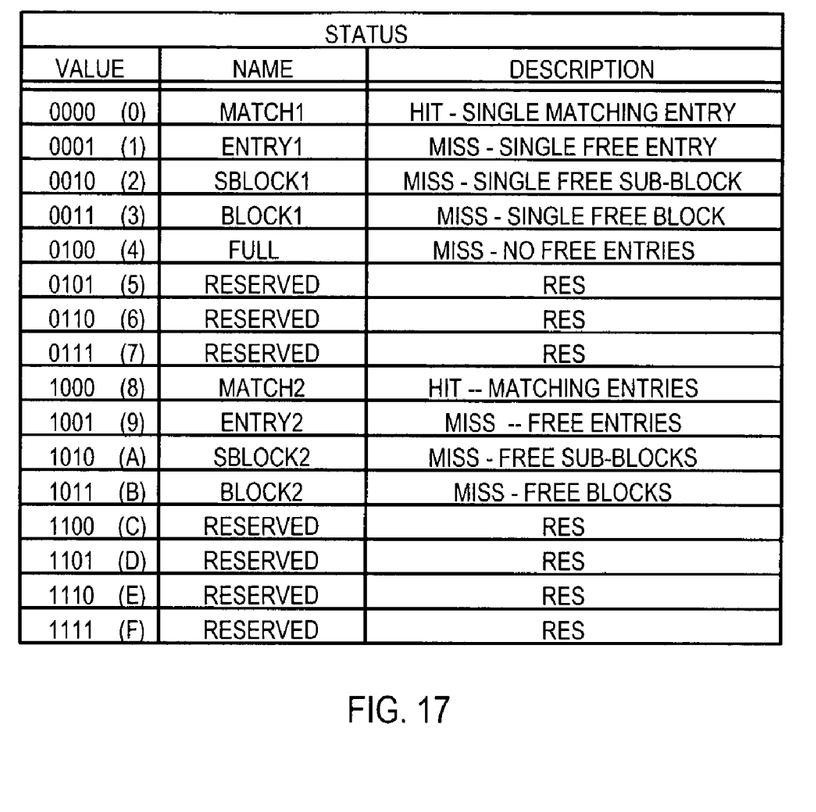
FIG. 17 is a diagram showing particular status values according to an embodiment.

Referring now to FIG. 17, a table is set forth illustrating very particular status values. In the example of FIG. 17, status values are represented by particular binary codes, but could be indicated by other means, such as a "flag" bit for each case. Additional binary codes shown as "reserved" may be reserved for other types of messages, such as error messages or the like. Like previous examples, FIG. 17 shows a case in which a lower magnitude value VALUE has a higher precedence. Of course, alternate embodiments could include arrangements in which a higher magnitude status value VALUE has a higher precedence.

Figure 18:
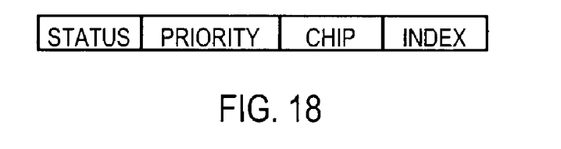
FIG. 18 is diagram showing response data fields according to an embodiment.

FIG. 18 shows a very particular example of response fields. A status field STATUS, CHIP field, and index FIELD may store data according to the various embodiments described above. In addition, a priority field PRIORITY is also included. The generation of priority values was described in detail above with reference to FIG. 16.

It is understood that while the embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A search engine system, comprising:
   at least one search engine that receives a key value for comparison with data values stored in a plurality of entries; and
   at least one voting section that generates an output search status value in response to at least two received search status values generated from a same search request; wherein the search status values correspond to types of search responses, such responses including a single match response that indicates the key value matches one searched entry of the search engine, and a single free entry response that indicates the key does not match any searched entries of the search engine and at least one entry does not store a valid data value.

2. The search engine system of claim 1, wherein:
the voting section generates the output search status value based on a predetermined precedence of the received search status values with respect to one another for certain of the received search status values.

3. The search engine system of claim 1, wherein:
at least one search engine that receives a key value for comparison with data values stored in a plurality of entries; and
the search status values correspond to types of responses selected from the group consisting of: a multiple free entry response that indicates the key does not match any searched entries of the search engine and at least two entries do not store valid data values; a single free sub-block response that indicates the key does not match any searched entries of the search engine and a sub-block of entries does not store valid data values, where a sub-block includes a plurality of entries; a multiple free sub-block response that indicates the key does not match any searched entries of the search engine and at least two sub-blocks do not store valid data values; a single free block response that indicates the key does not match any entries of the search engine and a block of entries does not store valid data values, where a block includes a plurality of sub-blocks; a multiple free block response that indicates the key does not match any searched entries of the search engine and at least two blocks do not store valid data values.

4. The search engine system of claim 1, wherein:
the at least one voting section outputs a corresponding multiple result search status value when the at least two received search status values indicate a same predetermined single result search status value.

5. The search engine system of claim 4, wherein:
the predetermined single result search status values and corresponding multiple search result status values are selected from the group consisting of: a single free entry response that indicates a key does not match any searched entries of the search engine and at least one entry does not store a valid data value and corresponding multiple free entries response; a single free sub-block response that indicates a key does not match any searched entries of the search engine and a sub-block of entries does not store valid data values, where a sub-block includes a plurality of entries and a corresponding multiple free sub-blocks response; and a single free block response that indicates a key does not match any searched entries of the search engine and a block of entries does not store valid data values, where a block includes a plurality of sub-blocks and a corresponding multiple free blocks response.

6. The search engine system of claim 1, further including:
a plurality of search engines each having a unique device identification value; and
the at least two received search status values further include different device identification values, and the voting section generates the output search status based on a precedence between device identification values when the at least two responses both include a same predetermined search status value.

7. The search engine system of claim 1, wherein:
the voting section includes at least one compare circuit for comparing a status value of a first response with a status value of a second response.

8. The search engine system of claim 7, wherein:
the compare circuit includes at least one magnitude comparator.

9. The search engine system of claim 1, further including:
a circuit that applies search key values to one of at least two portions of entries in a search engine device and provides a portion indication to the voting section that specifies which portion the search key is compared to.

10. The search engine system of claim 1, further including:
at least one search engine that includes
at least two groups of entries that store data values for comparison with a search key, and
a priority store associated with each group of entries for storing a priority value for the group of entries, and
the at least one voting section further generates an output priority value in response to at least two received priority values generated from the same search request.

11. The search engine system of claim 10, wherein:
the at least one search engine includes a first mode and a second mode; and
each priority value corresponds to a physical location of the associated group of entries in the first mode, and is programmable in the second mode.

* * * * *